US011309353B2

(12) United States Patent
Goto et al.

(10) Patent No.: US 11,309,353 B2
(45) Date of Patent: Apr. 19, 2022

(54) SPACER-DEFINED BACK-END TRANSISTOR AS MEMORY SELECTOR

(71) Applicant: Taiwan Semiconductor Manufacturing Co., Ltd., Hsin-Chu (TW)

(72) Inventors: Ken-Ichi Goto, Hsin-Chu (TW); Chung-Te Lin, Tainan (TW); Mauricio Manfrini, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/078,583

(22) Filed: Oct. 23, 2020

(65) Prior Publication Data
US 2021/0343787 A1      Nov. 4, 2021

Related U.S. Application Data

(60) Provisional application No. 63/017,731, filed on Apr. 30, 2020.

(51) Int. Cl.
*H01L 27/24* (2006.01)
*H01L 27/22* (2006.01)

(52) U.S. Cl.
CPC ........ *H01L 27/228* (2013.01); *H01L 27/2436* (2013.01)

(58) Field of Classification Search
CPC .............. H01L 27/228; H01L 27/2436; H01L 27/11206; H01L 27/224; H01L 43/08; H01L 43/02; H01L 43/10; G11C 11/1673; G11C 11/161

USPC ........................ 257/43; 438/85, 86, 104, 754
See application file for complete search history.

(56) References Cited

U.S. PATENT DOCUMENTS

| | | | |
|---|---|---|---|
| 2014/0117304 A1 | 5/2014 | Park | |
| 2015/0060749 A1 | 3/2015 | Nakakubo et al. | |
| 2015/0090949 A1* | 4/2015 | Chang | H01L 27/2436 257/4 |
| 2015/0213887 A1 | 7/2015 | Ota et al. | |
| 2018/0301624 A1* | 10/2018 | Yang | H01L 27/2436 |
| 2018/0351099 A1* | 12/2018 | Yang | H01L 45/1253 |
| 2019/0164602 A1* | 5/2019 | Tu | G11C 13/0007 |
| 2019/0386062 A1 | 12/2019 | Wang | |

* cited by examiner

*Primary Examiner* — Didarul A Mazumder
(74) *Attorney, Agent, or Firm* — Eschweiler & Potashnik, LLC

(57) ABSTRACT

The present disclosure, in some embodiments, relates to a memory device. In some embodiments, the memory device comprises a substrate and an interconnect structure disposed over the substrate. The interconnect structure comprises stacked interconnect metal layers disposed within stacked interlayer dielectric (ILD) layers. A memory cell is disposed between an upper interconnect metal layer and an intermediate interconnect metal layer. A selecting transistor is connected to the memory cell and disposed between the intermediate interconnect metal layer and a lower interconnect metal layer. By placing the selecting transistor within the back-end interconnect structure between two interconnect metal layers, front-end space is saved, and more integration flexibility is provided.

20 Claims, 14 Drawing Sheets

SPACER-DEFINED BACK-END TRANSISTOR AS MEMORY SELECTOR

REFERENCE TO RELATED APPLICATION

This application claims the benefit of U.S. Provisional Application No. 63/017,731, filed on Apr. 30, 2020, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory is able to store data when power is removed. Resistive random-access memory is a promising candidate for a next generation non-volatile memory technology. This is because resistive random-access memory devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
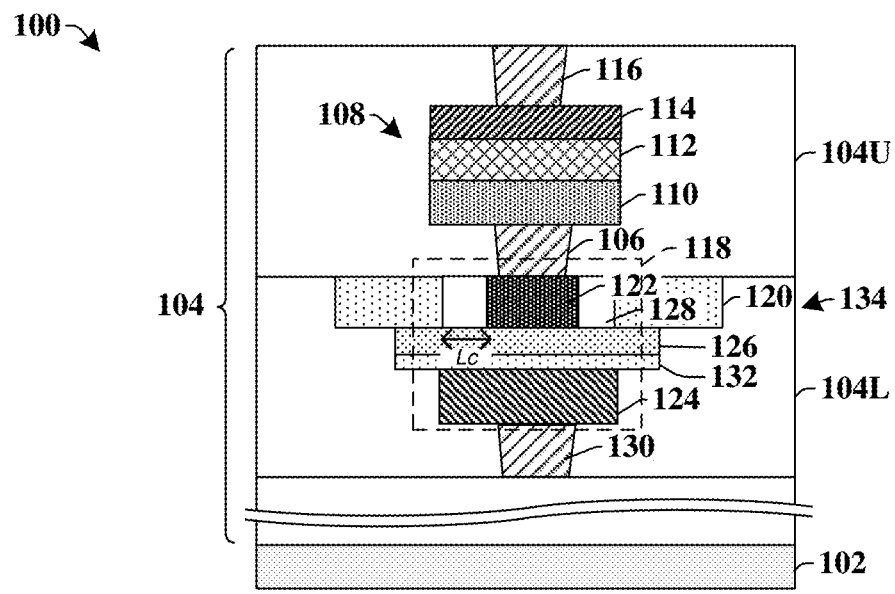
FIG. 1 illustrates a cross-sectional view of some embodiments of a memory device comprising a back-end-of-line (BEOL) selecting transistor.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The semiconductor industry continues to improve the integration density of various electronic devices (e.g., transistors, diodes, resistors, capacitors, etc.) by, for example, reducing minimum feature sizes and/or arranging electronic devices closer to one another, which allows more components to be integrated into a given area. As the nodes of fabrication continue to shrink, front-end-of-line (FEOL) transistor becomes the major bottleneck to drive high-density non-volatile memories (NVMs), such as in magnetoresistive random access memory (MRAM) devices. MRAM's operation requires a high write current (for example, greater than 200 µA/µm). One way to obtain this high write current is to enlarge transistor dimensions or to adopt multiple transistors for one memory element. For example, some proposed schematics use two transistors or more for one memory element in order to have enough drive current. Those approaches pose a large FEOL area penalty.

In view of above, the present disclosure relates to a back-end-of-line (BEOL) transistor used as a selecting transistor for a memory device and associated manufacturing methods to enable high-density non-volatile memory devices. In some embodiments, the memory device comprises a substrate. A back-end interconnect structure is disposed over the substrate and comprises a plurality of interconnect metal layers one stacked over another. A memory cell is disposed between an upper interconnect metal layer and an intermediate interconnect metal layer. A selecting transistor is disposed between the intermediate interconnect metal layer and a lower interconnect metal layer. By placing the selecting transistor within the back-end interconnect structure between two interconnect metal layers, front-end space is freed-up, and more integration flexibility is provided.

In some further embodiments, the selecting transistor is a planar transistor. A selector gate electrode of the selecting transistor can be disposed on and electrically coupled to the lower interconnect metal layer. A selector channel layer is disposed over the selector gate electrode. A selector source/drain layer is disposed on the selector channel layer. The selector source/drain layer comprises a first selector source/drain region and a second selector source/drain region separated by a sidewall spacer. A portion of the channel layer directly under the sidewall spacer serves as the channel region of the selecting transistor. Thus, a width of the sidewall spacer defines a channel length of the selecting transistor. In some embodiments, the channel layer comprises an oxide semiconductor (OS) material. For example, the channel layer can be made of indium gallium zinc oxide (IGZO). The OS material channel region provides ultra-low leakage currents ($I_{ON}/I_{OFF}>10^{13}$) and can be used to fabricate a BEOL compatible transistor for memory devices. In some embodiments, the selector source/drain regions can have various shapes. For example, the second selector source/drain region can be a circle, a square, a single-fin, a multiple fin, an oval or other application shapes. The sidewall spacer surrounds the second selector source/drain region, and the first selector source/drain region enclose outer peripherals of the sidewall spacer.

Also in some embodiments, the memory cell comprises a bottom electrode and a top electrode separated by a data storage structure. The selecting transistor may be connected to the bottom electrode of the memory cell through the intermediate interconnect metal layer. The storage structure and the top electrode are stacked over the bottom electrode. In some embodiments, the data storage structure is a magnetic tunnel junction (MTJ) or a spin-valve. In such cases, the memory cell is referred as a magnetic memory cell, and the memory device made of an array of such memory cells is referred as a MRAM device. In some alternative embodiments, the data storage structure is a metal-insulator-metal (MIM) stack, and the memory cell may be a resistance memory cell. Other structures for the data storage structure and/or other memory cell types for the memory cell are also amenable.

FIG. 1 illustrates a cross-sectional view of some embodiments of a memory device 100 comprising a selecting transistor 118. In some embodiments, the memory device 100 comprises a memory cell 108 disposed within an interconnect structure 104 over a substrate 102. The interconnect structure 104 comprises stacked interconnect metal layers disposed within stacked inter-level dielectric (ILD) layers. In some embodiments, the stacked ILD layers comprise a lower ILD layer 104L arranged between the memory cell 108 and the substrate 102, and an upper ILD layer 104U surrounding the memory cell 108. The lower ILD layer 104L and the upper ILD layer 104U may each comprise one or more dielectric layer. In some embodiments, the stacked interconnect metal layers comprise a lower interconnect metal layer 130, an intermediate interconnect metal layer 106 stacked over the lower interconnect metal layer 130, and an upper interconnect metal layer 116 disposed over the intermediate interconnect metal layer 106.

The memory cell 108 may comprise a bottom electrode 110, a data storage structure 112 arranged over the bottom electrode 110, and a top electrode 114 arranged over the data storage structure 112. The upper interconnect metal layer 116 extends through the upper ILD layer 104U to reach on the top electrode 114. In some embodiments, the bottom electrode 110 and the top electrode 114 may comprise tantalum nitride, titanium nitride, tantalum, titanium, platinum, nickel, hafnium, zirconium, ruthenium, iridium, or the like. In some embodiments, the data storage structure 112 is a magnetic tunnel junction (MTJ) or a spin-valve. In such cases, the memory cell 108 is referred as a magnetic memory cell, and the memory device 100 made of an array of such memory cells 108 is referred as a magnetoresistive random access memory (MRAM) device. In such embodiments, the data storage structure 112 may comprise a magnetic tunnel junction, a ferroelectric capacitor or junction, or the like. In some alternative embodiments, the data storage structure 112 is a metal-insulator-metal (MIM) stack, and the memory cell 108 may be a resistance memory cell. In such cases, the memory cell 108 is referred as a resistive memory cell, and the memory device 100 made of an array of such memory cells 108 is referred as a RRAM device. In such embodiments, the data storage structure 112 comprises a high-k dielectric material, such as hafnium dioxide ($HfO_2$), zirconium dioxide ($ZrO_2$), aluminum oxide ($Al_2O_3$), tantalum pentoxide ($Ta_2O_5$), hafnium aluminum oxide (HfAlO), hafnium zirconium oxide (HfZrO), or the like. Other structures for the data storage structure 112 and/or other memory-cell types for the memory cell 108 are also amenable.

In some embodiments, the selecting transistor 118 is electrically coupled to the bottom electrode 110 of the memory cell 108 through the intermediate interconnect metal layer 106. In some embodiments, a source/drain layer 134 is disposed under the intermediate interconnect metal layer 106. The source/drain layer 134 comprises a first selector source/drain region 120 and a second selector source/drain region 122 separated by a sidewall spacer 128. A selector channel layer 126 is disposed under the source/drain layer 134. A selector gate dielectric layer 132 is disposed under the selector channel layer 126 and separating a selector gate electrode 124 from the selector channel layer 126. The selector gate electrode 124 may be disposed on a lower interconnect metal layer 130 and surrounded by the lower ILD layer 104L. During operation, a drain-source voltage is applied between the first selector source/drain region 120 and the second selector source/drain region 122. A gate-source voltage is applied between the selector gate electrode 124 and the first selector source/drain region 120. If the gate-source voltage is sufficient, a channel path in the selector channel layer 126 is turned on connecting the first selector source/drain region 120 and the second selector source/drain region 122. A width of the sidewall spacer 128 defines a channel length Lc of the selecting transistor 118 in the selector channel layer 126 directly under the sidewall spacer 128. An interface perimeter between the sidewall spacer 128 and the second selector source/drain region 122 defines a channel width of the selecting transistor 118.

In some embodiments, the first selector source/drain region 120 and the second selector source/drain region 122 comprise doped semiconductor material (e.g., p-doped or n-doped polysilicon), and/or Titanium nitride (TiN), tantalum nitride (TaN), tungsten (W), copper (Cu), or other CMOS contact metals. The first selector source/drain region 120 and the second selector source/drain region 122 may each have a thickness in a range of from about 10 nm to about 50 nm. In some embodiments, the sidewall spacer 128 may be a single layer of non-conductive material. In some alternative embodiments, the sidewall spacer 128 may include multiple layers of the same or different materials collectively insulating the second selector source/drain region 122 from the first selector source/drain region 120. For example, the sidewall spacer 128 may comprise a dielectric material or multiple dielectric materials such as silicon dioxide, silicon nitride, or the like. The sidewall spacer 128 can have a thickness in a range of from about 5 nm to about 30 nm. In some embodiments, the selector channel layer 126 comprises an oxide semiconductor (OS) material. For example, the channel layer can be made of such as indium gallium zinc oxide (IGZO), indium zinc oxide (IZO), indium tin oxide or indium titanium oxide (ITO), or another oxide semiconductor material. The selector channel layer 126 can have a thickness in a range of from about 3 nm to about 50 nm, or about 5 nm to about 30 nm. The OS material channel region provides ultra-low leakage and can be used to fabricate a BEOL compatible transistor for memory devices. In some embodiments, the selector gate dielectric layer 132 comprise aluminum oxide ($Al_2O_3$), Hafnium oxide ($HfO_2$), tantalum oxide ($Ta_2O_5$), Zirconium oxide ($ZrO_2$), Titanium oxide ($TiO_2$), strontium titanium oxide ($SrTiO_3$), or another high-k dielectric material, among others. The selector gate dielectric layer 132 may have a thickness in a range of from about 1 nm to about 15 nm, or about 1 nm to about 5 nm. By placing the selecting transistor within back-end interconnect structure between two interconnect metal layers, front-end becomes available for novel logic functions, and more integration flexibility is provided.

Figure 2:
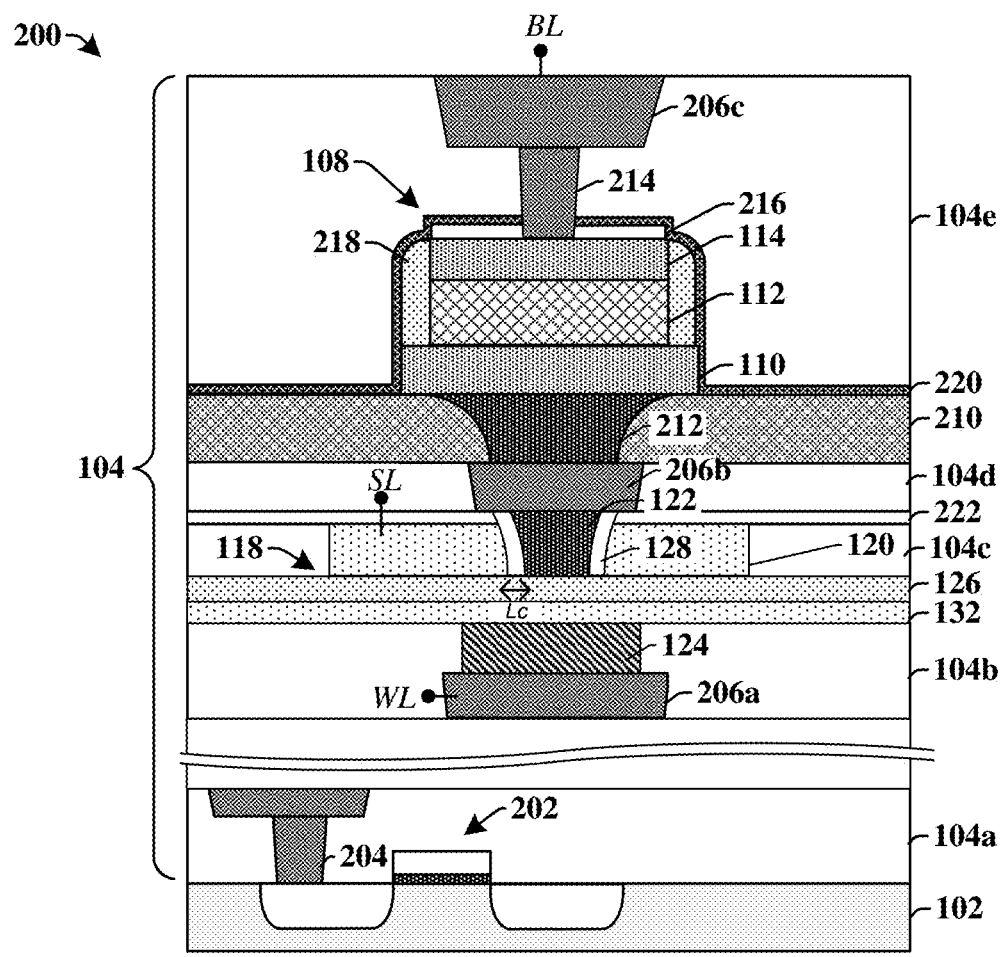
FIG. 2 illustrates a cross-sectional view of some additional embodiments of a memory device comprising a BEOL selecting transistor.

FIG. 2 illustrates a cross-sectional view of a memory device 200 comprising a selecting transistor 118 according to some additional embodiments with more details. In some embodiments, a logic device 202 is disposed within a substrate 102. The logic device 202 may comprise a transistor device (e.g., a MOSFET device, a BJT, or the like). An interconnect structure 104 is disposed over the logic device 202 and the substrate 102. The interconnect structure 104 comprises a plurality of stacked ILD layers 104a-104e that laterally surround a plurality of interconnect metal layers configured to provide electrically connection. In some embodiments, the interconnect metal layers may comprise a conductive contact 204 landing on the logic device 202 and interconnect lines 206a-206c and interconnect vias disposed over the conductive contact 204 and surrounded by the plurality of stacked ILD layers 104a-104e.

In some embodiments, a first interconnect line 206a is disposed within a second ILD layer 104b over the first ILD layer 104a. The first interconnect line 206a may function as a word line of the memory device 200. The selecting transistor 118 comprises a selector gate electrode 124 stacked on the first interconnect line 206a and configured to control current flow between a first selector source/drain region 120 and a second selector source/drain region 122 through a selector channel layer 126. In some embodiments, the selector gate electrode 124 may comprise the same conductive material as the first interconnect line 206a and may be seamless from the first interconnect line 206a. Alternatively, the selector gate electrode 124 may comprise a conductive material different from the first interconnect line 206a. A selector gate dielectric layer 132 may be disposed between the selector gate electrode 124 and the selector channel layer.

In some embodiments, the first selector source/drain region 120 and the second selector source/drain region 122 are disposed on the selector channel layer 126 and separated from each other by a sidewall spacer 128. The sidewall spacer 128 may enclose an outer sidewall of the second selector source/drain region 122. The first selector source/drain region 120 may enclose an outer sidewall of the sidewall spacer 128 and may be surrounded by a third ILD layer 104c. In some embodiments, a dielectric layer 222 is disposed on the first selector source/drain region 120 and the third ILD layer 104c and surround the sidewall spacer 128 or the second selector source/drain region 122. In some embodiments, the sidewall spacer 128 covers a sidewall surface of the second selector source/drain region 122. The first selector source/drain region 120 and the dielectric layer 222 may collectively cover an outer sidewall of the sidewall spacer 128. In some embodiments, the dielectric layer 222 may comprise dielectric materials such as silicon dioxide, silicon nitride, or the like. The dielectric layer 222 can have a thickness in a range of from about 1 nm to about 5 nm.

In some embodiments, the first selector source/drain region 120 is coupled to a source line SL. The second selector source/drain region 122 is coupled to the memory cell 108 through a second interconnect line 206b, which is surrounded by a fourth ILD layer 104d. The second interconnect line 206b may be arranged over the first selector source/drain region 120 and separating from the first selector source/drain region 120 by the dielectric layer 222.

In some embodiments, a lower insulating structure 210 is disposed over the fourth ILD layer 104d. The lower insulating structure 210 comprises sidewalls that define an opening extending through the lower insulating structure 210. In various embodiments, the lower insulating structure 210 may comprise one or more of silicon nitride, silicon dioxide, silicon carbide, or the like. A bottom electrode via 212 is disposed in the opening of the lower insulating structure 210 and lands on the second interconnect line 206b. The memory cell 108 is arranged on the bottom electrode via 212. In some embodiments, the memory cell 108 comprises a bottom electrode 110 that is separated from a top electrode 114 by way of a data storage structure 112. In some embodiments, a hard mask layer 216 may be disposed on the top electrode 114. A sidewall spacer 218 may be disposed on opposing sides of the top electrode 114 and the hard mask layer 216. In some embodiments, the hard mask layer 216 may comprise a metal (e.g., titanium, tantalum, or the like) and/or a dielectric (e.g., a nitride, a carbide, or the like). In some embodiments, the sidewall spacer 218 may comprise an oxide (e.g., silicon rich oxide), a nitride (e.g., silicon nitride), a carbide (e.g., silicon carbide), or the like.

In some embodiments, an upper insulating structure 220 is disposed over the memory cell 108 and on the lower insulating structure 210. The upper insulating structure 220 continuously extends from a first position directly over the memory cell 108 to a second position abutting an upper surface of the lower insulating structure 210. The upper insulating structure 220 separates the memory cell 108 from a fifth ILD layer 104e. The upper insulating structure 220 may comprise one or more dielectric materials such as silicon nitride, silicon dioxide, silicon carbide, or the like. In some embodiments, an upper interconnect metal layer 116 extends through the fifth ILD layer 104e to electrically contact the top electrode 114. The upper interconnect metal layer 116 may comprise a top electrode via 214 disposed through the hard mask layer 216 and the upper insulating structure 220 and a third interconnect line 206c connecting to the top electrode via 214. The third interconnect line 206c may function as a bit line of the memory device 200.

During operation, signals (e.g., voltages and/or currents) may be selectively applied to the word line WL, the source line SL, and the bit line BL to read data from and to write data to the memory cell 108.

Figure 3:
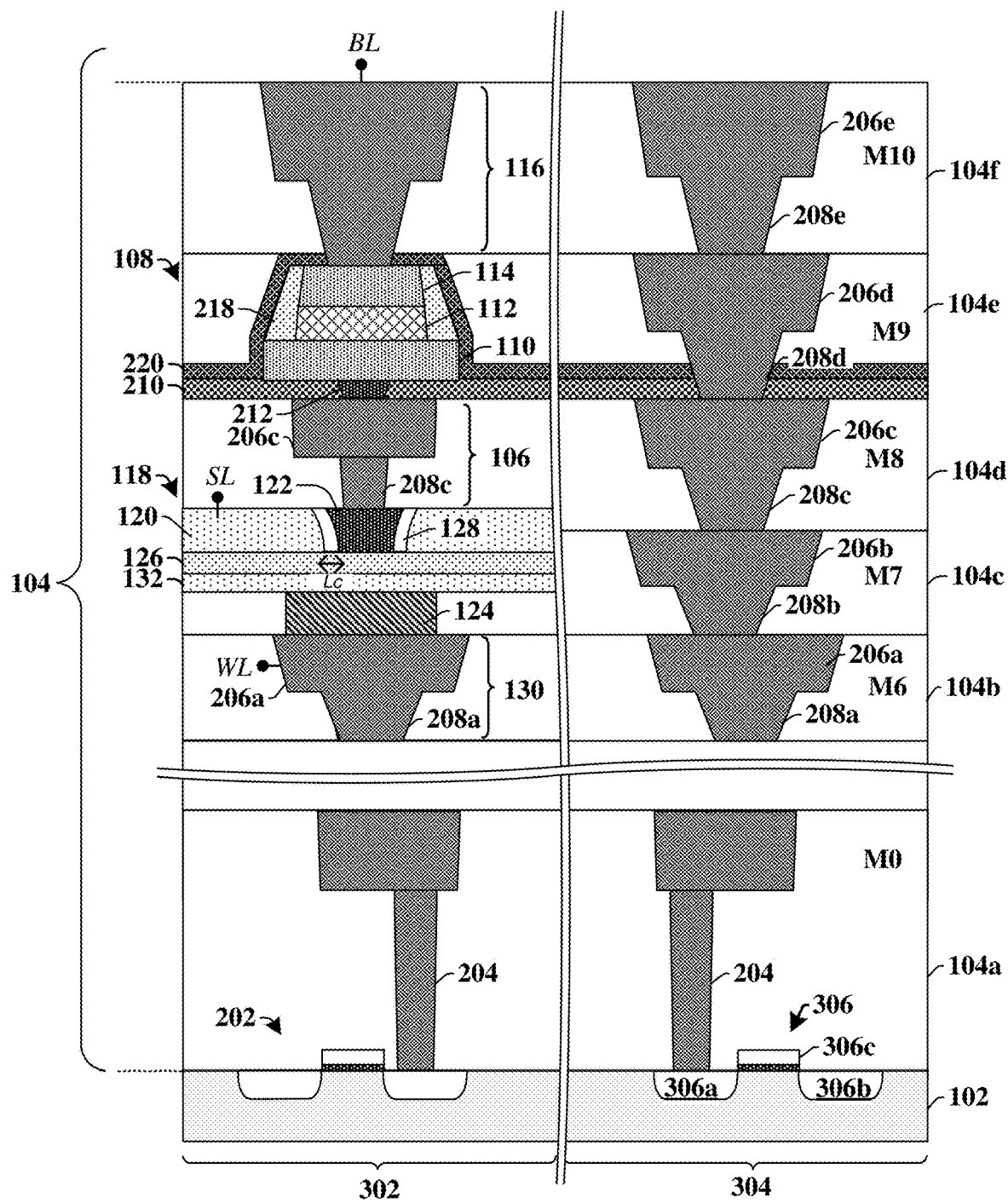
FIG. 3 illustrates a cross-sectional view of some additional embodiments of a memory device comprising a BEOL selecting transistor.

FIG. 3 illustrates a cross-sectional view of a memory device 300 comprising a selecting transistor 118 according to some additional embodiments. The memory device 300 comprises a substrate 102 including a memory region 302 and a logic region 304. The logic region 304 may comprise a logic device 306 arranged within the substrate 102. For example, the logic device 306 may include a transistor comprising a first source/drain region 306a, a second source/drain region 306b separated from the first source/drain region 306a by a channel region, and a gate structure 306c disposed over the channel region. A conductive contact 204 may land on the first source/drain region 306a or the second source/drain region 306b. Similarly, another logic device 202 may be arranged within the substrate 102 in the memory region 302. In some alternative embodiments, the logic devices 202, 306 may be FinFET devices, nanowire devices, or other gate-all-around (GAA) devices. Thus, more integration flexibility is provided by utilizing the BEOL selecting transistor.

An interconnect structure 104 is disposed over the substrate 102 overlying the logic devices 202, 306. The interconnect structure 104 comprises a plurality of metal layers one stacked over another and including stacked metal lines 206a-206e and metal vias 208a-208e disposed within stacked ILD layers 104a-104f. In some embodiments, the plurality of stacked ILD layers 104a-104f may comprise one or more of silicon dioxide, a fluorosilicate glass, a silicate glass (e.g., borophosphate silicate glass (BSG), phosphosilicate glass (PSG), borophosphosilicate glass (BPSG), fluorosilicate glass (FSG), undoped silicate glass (USG), or the like. In some embodiments, adjacent ILD layers 104a-104f may be separated by an etch stop layer (not shown) comprising a nitride, a carbide, or the like. The plurality of metal layers is referred by numerals in industry as M0, M1, M2, M3 . . . from a lower position closer to the substrate to an upper position away from the substrate. M0 is referred to a metal layer closest to the substrate and comprising metal lines electrically coupling to active regions of the logic devices through conductive contacts 204. M1 (not shown) is referred to a next metal layer stacked over the metal layer M0 and comprising metal lines electrically coupling to metal lines of the metal layer M0 through metal vias. Similarly, Mn+1 is referred to a next metal layer stacked over an underlying metal layer Mn and comprising metal lines electrically coupling to metal lines of the underlying metal layer Mn through metal vias, n is a positive integral number. It is emphasized that though some specific metal layer numbers are given hereafter, such as M6, M7, M8, M9, M10, etc., these specific numbers are not for limiting purpose, and various metal layers can be used for different applications.

A memory cell 108 is disposed between an upper interconnect metal layer 116 and an intermediate interconnect metal layer 106, for example, between M10 and M8 as shown in FIG. 3. In some embodiments, the memory cell 108 is inserted within one or more interconnect metal layers (for example, M9) between the intermediate interconnect metal layer 106 and the upper interconnect metal layer 116 (for example, between M8 and M10). The memory cell 108 may comprise a bottom electrode 110 that is separated from a top electrode 114 by way of a data storage structure 112. A hard mask layer 216 may be disposed on the top electrode 114. A sidewall spacer 218 may be disposed on opposing sides of the top electrode 114 the hard mask layer 216. In some embodiments, a selecting transistor 118 is connected to the bottom electrode 110 of the memory cell 108. The selecting transistor 118 is disposed between the intermediate interconnect metal layer 106 and a lower interconnect metal layer 130, for example, between M8 and M6 as shown in FIG. 3.

In some embodiments, the selecting transistor 118 is inserted within one or more interconnect metal layer (for example, M7) between the intermediate interconnect metal layer 106 and the lower interconnect metal layer 130 (for example, between M8 and M6). A selector gate electrode 124 of the selecting transistor 118 is disposed within a dielectric layer and electrically coupled to the lower interconnect metal layer 130. A selector gate dielectric layer 132 and a selector channel layer 126 may be disposed in the memory region 302 on the selector gate electrode 124 and the surrounding dielectric layer. A first selector source/drain region 120 and a second selector source/drain region 122 may be disposed in the memory region 302 on the selector channel layer 126 and separated from each other by a sidewall spacer 128. In some embodiments, the first selector source/drain region 120 is coupled to a source line SL. The second selector source/drain region 122 is coupled to the memory cell 108 through one or more interconnect lines 206c and one or more interconnect vias 208c, which is surrounded by one or more ILD layers.

As noted above, the selecting transistor 118 and the memory cell 108 can be flexibly positioned within various metal layers. In some embodiments, the selecting transistor 118 is located above fourth interconnect metal layer M4, and thus at least four interconnect metal layers (M1, M2, M3, M4) are disposed between the selector gate electrode 124 and the substrate 102. Per routing needs, the interconnect structure 104 has denser metal lines with a smaller size in a lower metal layer than in an upper metal layer. It would consume precious routing area if the selecting transistor 118 is positioned within a metal layer lower than the fourth interconnect metal layer M4. Above the fourth interconnect metal layer M4, exact location of the selecting transistor 118 can be determined with reference to the routing needs, and thus provide design flexibility.

Figure 4:
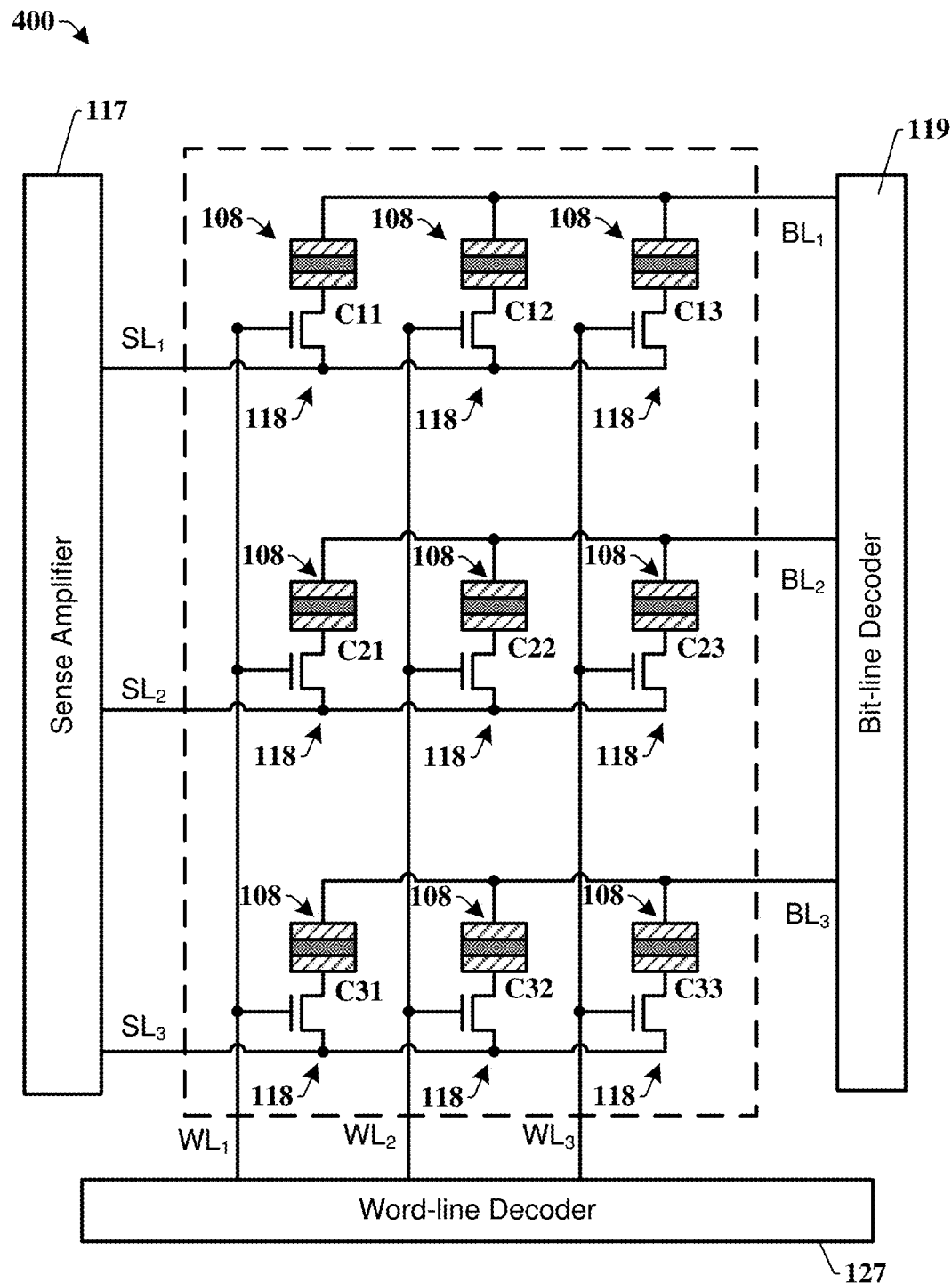
FIG. 4 illustrates a block diagram of some embodiments of a portion of a memory array having a plurality of memory units.

FIG. 4 illustrates a block diagram of a portion of a memory array 400 having a plurality of memory units C11-C33. The memory units C11-C33 are arranged within the memory array 400 in rows and/or columns. The memory array 400 comprises a plurality of selecting transistors 118 correspondingly connected to a plurality of memory cells 108. In some embodiments, device structures disclosed associated with FIG. 1, FIG. 2, or FIG. 3 can be incorporated as some embodiments of the individual memory units C11-C33 of the memory array 400. The plurality of selecting transistors 118 is disposed within an interconnect structure between a lower interconnect metal layer and an upper interconnect metal layer of the interconnect structure.

Although the memory array 400 is illustrated as having 3 rows and 3 columns, the memory array 400 may have any number of rows and any number of columns. Each of the memory units C11-C33 may include a memory cell 108 coupled to a selecting transistor 118. The selecting transistor 118 is configured to selectively provide access to the memory cell 108 selected while inhibiting leakage currents through non-selected memory units.

The memory units C11-C33 may be controlled through bit-lines $BL_1$-$BL_3$, word-lines $WL_1$-$WL_3$, and source lines $SL_1$-$SL_3$. The word-lines $WL_1$-$WL_3$ may be used to operate the selecting transistors 118 corresponding to the memory units C11-C33. When a selecting transistor 118 for a memory cell 108 is turned on, a voltage may be applied to that memory cell. A bit line decoder 119 applies a read voltage or a write voltage to one of the bit-lines $BL_1$-$BL_3$. A word line decoder 127 applies another voltage to one of the word-lines $WL_1$-$WL_3$, which turns on the selecting transistor 118 for the memory units C11-C33 in a corresponding row. Together, these operations cause the read voltage or the write voltage to be applied to a selected memory unit among the memory units C11-C33.

Appling a voltage to a selected memory cell 108 results in a current. During read operations, a sense amplifier 117 determines the programming state of the selected memory cell based on the current. The sense amplifier 117 may be connected to source lines $SL_1$-$SL_3$. Alternatively, the sense amplifier 117 may be connected to bit-lines $BL_1$-$BL_3$. The sense amplifier 117 may determine the programming state of the memory cell 108 based on the current. In some embodiments, the sense amplifier 117 determines the programming state of the memory cell 108 by comparing the current to one or more reference currents. The sense amplifier 117 may convey the programming state determination to an I/O buffer, which may be coupled to a driver circuit to implement write and write verify operations. The driver circuit is configured to select a voltage to apply to selected memory unit for read, write, and write-verify operations.

It will be appreciated that the voltage of significance is an absolute value of a potential difference across the memory cell 108. For the memory array 400, applying a voltage to a selected memory cell means operating a word line $WL_1$-$WL_3$ to turn on the selecting transistor 118 corresponding to that memory cell and using the driver circuit to make the absolute value of the potential difference between the source line $SL_1$-$SL_3$ and the bit line $BL_1$-$BL_3$ corresponding to that cell equal in magnitude to that voltage. In some embodiments, applying a voltage to a memory cell is accomplished by coupling a corresponding bit line $BL_1$-$BL_3$ to the voltage while holding a corresponding source line $SL_1$-$SL_3$ at a ground potential. Also, source lines $SL_1$-$SL_3$ may be held at other potentials and the roles bit-lines $BL_1$-$BL_3$, and source line $SL_1$-$SL_3$ may be reversed.

Figure 5:
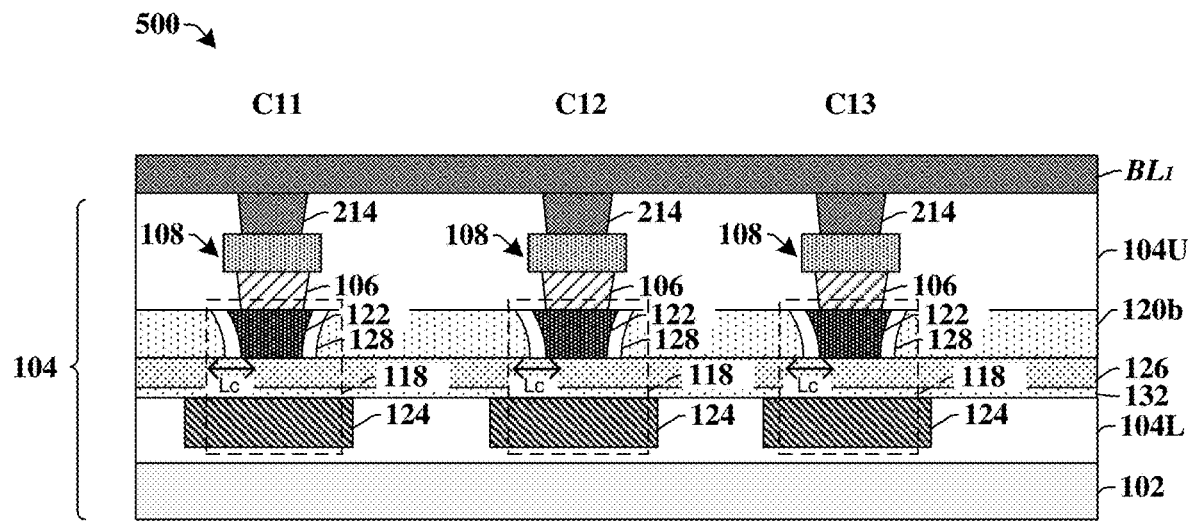
FIG. 5 illustrates a cross-sectional view of some embodiments of the memory array of FIG. 4 along a row direction according to some embodiments.

FIG. 5 illustrates a cross-sectional view 500 of the memory array 400 of FIG. 4 along a row direction according to some embodiments. For example, memory units shown in FIG. 5 can be the memory units C11, C12, and C13 of FIG. 4. Besides device structures disclosed associated with FIG. 1, FIG. 2, or FIG. 3, as shown in FIG. 4 and FIG. 5, in some embodiments, the memory units of one row, e.g., C11, C12, and C13, may share a common bit line $BL_1$ connecting individual memory cells 108 through individual top electrode vias 214.

Figure 6:
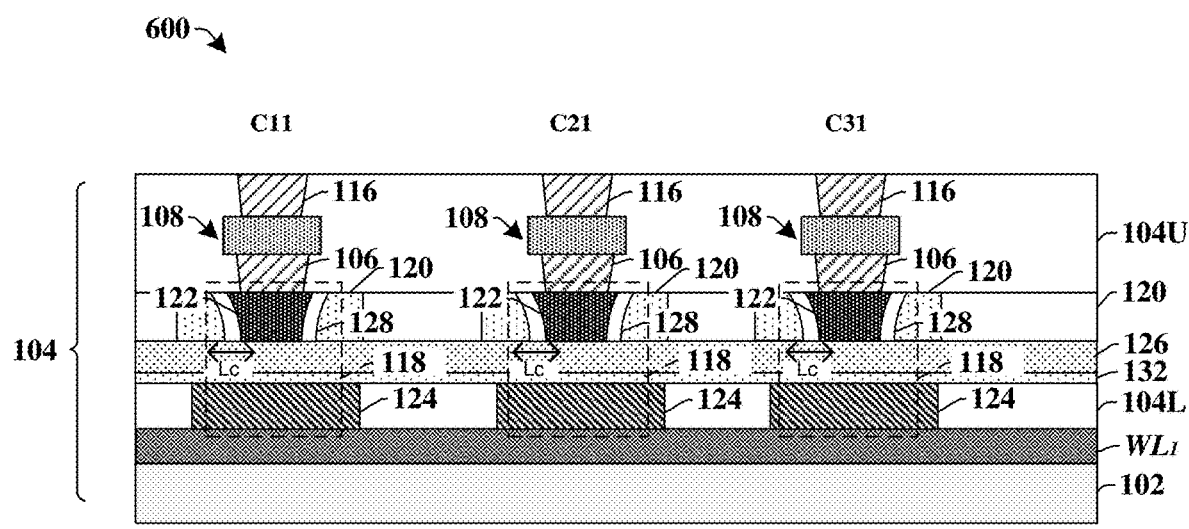
FIG. 6 illustrates a cross-sectional view of some embodiments of the memory array of FIG. 4 along a column direction according to some embodiments.

FIG. 6 illustrates a cross-sectional view 600 of the memory array 400 of FIG. 4 along a column direction according to some embodiments. For example, memory units shown in FIG. 6 can be the memory units C11, C21, and C31 of FIG. 4. Besides device structures disclosed associated with FIG. 1, FIG. 2, or FIG. 3, as shown in FIG. 4 and FIG. 6, in some embodiments, the memory units of one column, e.g., C11, C21, and C31, may share a common gate electrode or has individual gate electrodes connecting to a common word line $WL_1$ connecting individual selecting transistors 118 through individual selector gate electrodes 124.

FIGS. 7A-7D illustrate top views 700a-700d of the memory array 400 of FIG. 4 showing corresponding selecting transistors 118 according to some embodiments. As shown by FIGS. 7A-7D, the first selector source/drain regions 120 and the second selector source/drain regions 122 can have various shapes. For example, the second selector source/drain regions 122 can be discrete islands enclosed by the sidewall spacers 128. The sidewall spacers 128 can have discrete ring shapes. The first selector source/drain region 120 encloses an outer peripheral of the sidewall spacer 128. In such embodiments, a width of the sidewall spacer 128 defines a channel length of the selecting transistor 118, and a perimeter of the second selector source/drain region 122 defines a channel width of the selecting transistor 118. As an example, the channel length Lc can be in a range of from about 5 nm to about 30 nm. The channel width can be in a range of from about 50 nm to about 500 nm. A resulted drain-source current can reach a range of from about 50 µA to about 100 µA.

Figure 7A:
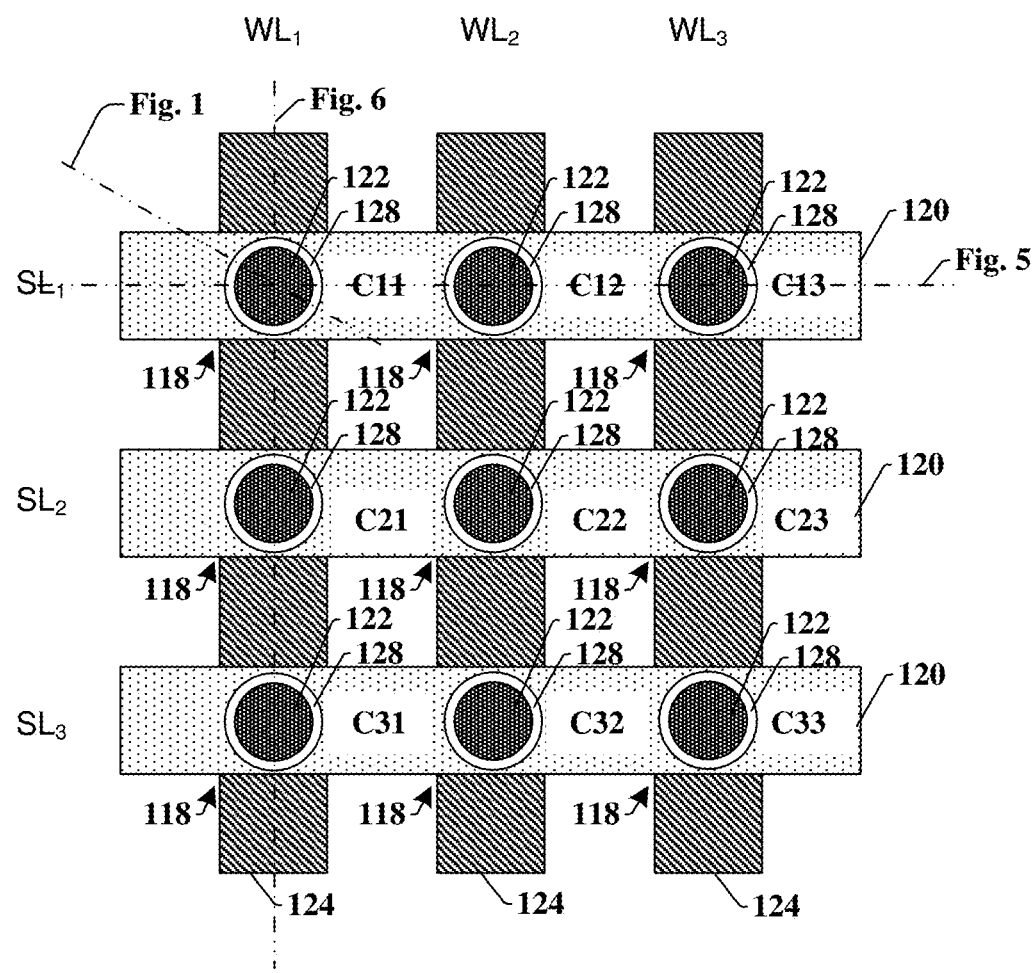
FIGS. 7A-7D illustrate top views of some embodiments of the memory array 400 of FIG. 4 showing corresponding selecting transistors.
Figure 7B:
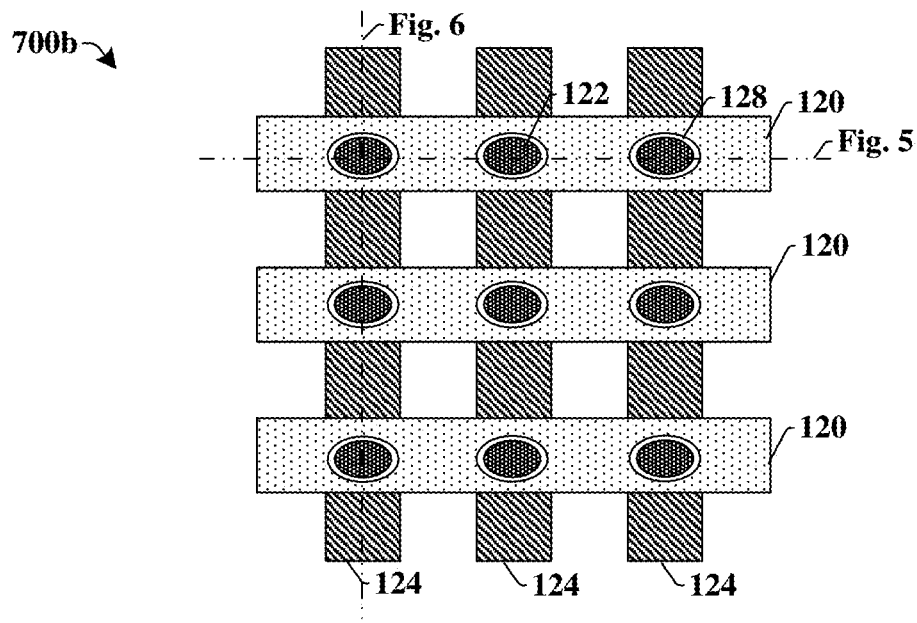
Figure 7C:
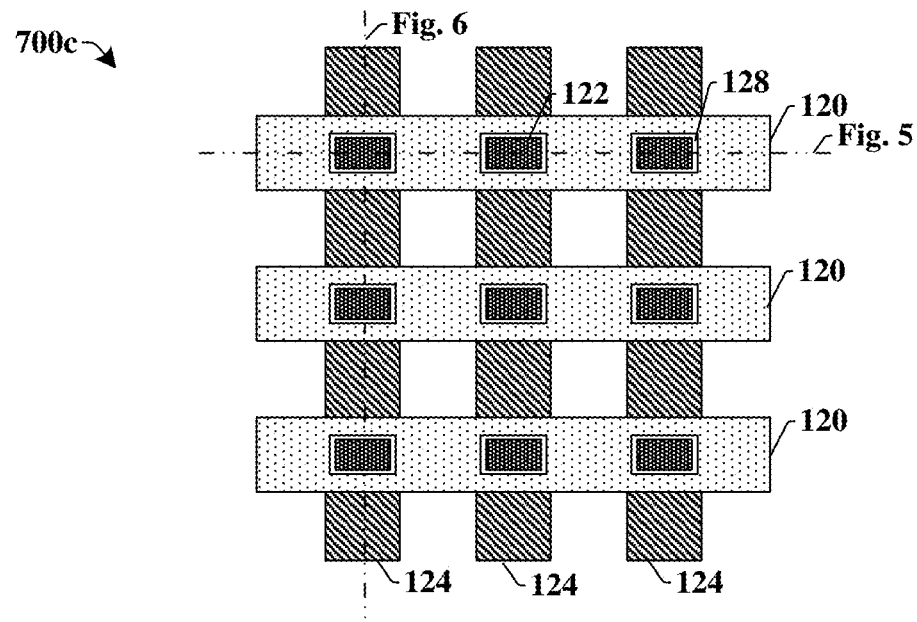
Figure 7D:
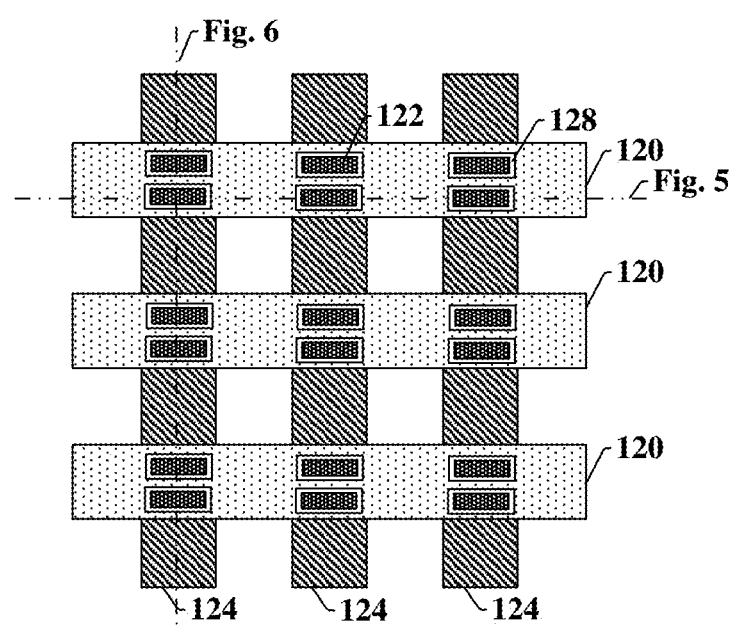

In some embodiments, the second selector source/drain region 122 can have a centro-symmetrical shape such as a round circle as shown in FIG. 7A, a square, or other orthopolygons. In some alternative embodiments, the second selector source/drain region 122 can have an axial symmetrical shape that is longer in a length direction of the shared first selector source/drain region 120 than a width direction of the shared first selector source/drain region 120, such that an area of the second selector source/drain region 122 can be enlarged by arranging a longer length of the second selector source/drain region 122. Examples of such second selector source/drain region 122 include an oval as shown in FIG. 7B, or a rectangular as shown in FIG. 7C. In some further alternative embodiments, the second selector source/drain region 122 may include multiple fins to further enlarge perimeters of the second selector source/drain region 122, i.e., the channel width of the selecting transistor 118. As a result, the drain current of the selecting transistor can be further increased. FIG. 7D shows the second selector source/drain region 122 having two rectangular fins as an example of those embodiments. Other applicable shapes not shown in the figures (e.g., a square, multiple round fins, etc.) are also amenable.

FIGS. 8-17 illustrate cross-sectional views 800-1700 of some embodiments of a method of forming a memory device comprising a BEOL selecting transistor. Although FIGS. 8-17 are described in relation to a method, it will be appreciated that the structures disclosed in FIGS. 8-17 are not limited to such a method, but instead may stand alone as structures independent of the method.

Figure 8:
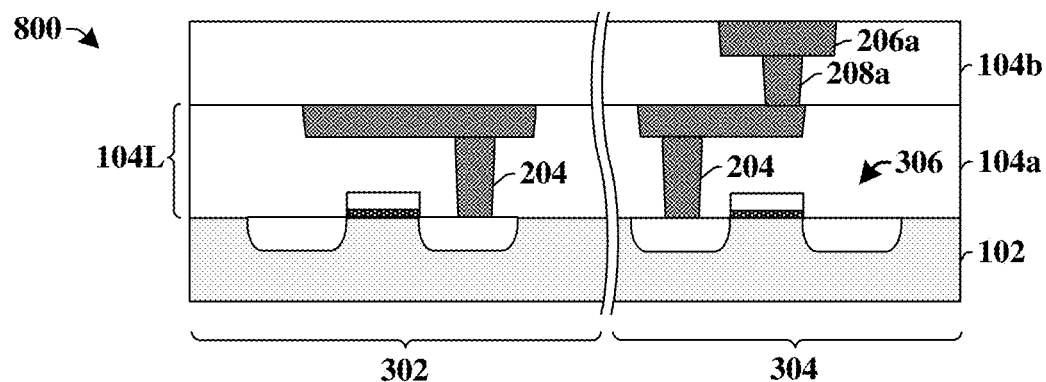
FIGS. 8-18 illustrate cross-sectional views of some embodiments of a method of forming a memory device comprising a BEOL selecting transistor.

As shown in a cross-sectional view 800 of FIG. 8, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. The substrate 102 comprises a memory region 302 and a logic region 304. In some embodiments, a logic device 306 is formed within the substrate 102. The logic device 306 may be formed in the memory region 302 or the logic region 304. The logic device 306 may comprise a transistor formed by depositing and patterning a gate dielectric film and a gate electrode film over the substrate 102 to form a gate dielectric and a gate electrode. The substrate 102 may be subsequently implanted to form a source region and a drain region within the substrate 102 on opposing sides of the gate electrode.

In some embodiments, one or more lower interconnect metal layers may be formed within one or more lower ILD layers formed over the logic device 306 and the substrate 102. In some embodiments, the one or more lower interconnect metal layers may comprise one or more of a conductive contact 204 formed in a first ILD layer 104a, a first interconnect line 206a and a first interconnect via 208a formed in a second ILD layer 104b, and more interconnect lines and vias stacked thereover (not shown). The one or one or more lower interconnect metal layers may be formed by repeatedly forming a lower ILD layer (e.g., an oxide, a low-k dielectric, or an ultra low-k dielectric) over the substrate 102, selectively etching the lower ILD layer to define a via hole and/or a trench within the lower ILD layer, forming a conductive material (e.g., copper, aluminum, etc.) within the via hole and/or the trench, and performing a planarization process (e.g., a chemical mechanical planarization process) to remove excess of the conductive material from over the lower ILD layer. The conductive contact 204, the interconnect line 206a/206b, and the interconnect via 208a shown in FIG. 8 are drawn for illustration purpose, and more or fewer layers of interconnect lines, vias and lower ILD layers in either memory region 302 or the logic region 304 can be adjusted by various applications.

Figure 9:
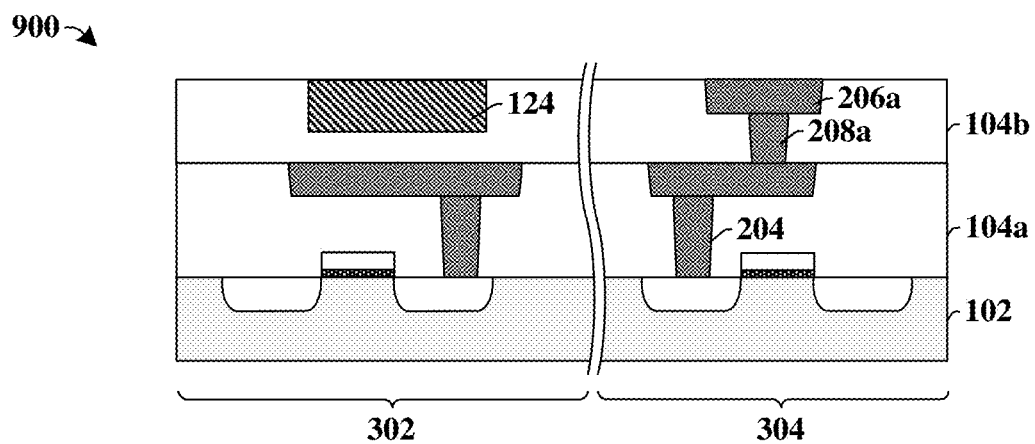

As shown in a cross-sectional view 900 of FIG. 9, a selector gate electrode 124 is formed within the second ILD layer 104b. The selector gate electrode 124 may be formed by selectively etching the second ILD layer 104b to define a trench within the second ILD layer 104b, forming a conductive material (e.g., tungsten, copper, aluminum, etc.) within the trench, and performing a planarization process (e.g., a chemical mechanical planarization process) to remove excess of the conductive material from over the second ILD layer 104b. In some embodiments, the selector gate electrode 124 is formed by a conductive material same with the first interconnect line 206a and the first interconnect via 208a. In some alternative embodiments, the selector gate electrode 124 is formed by a conductive material different from the first interconnect line 206a and the first interconnect via 208a. In some embodiments, the selector gate electrode 124 is formed by a deposition process followed by a planarization process (e.g., a chemical mechanical planarization process), and can have a thickness in a range of from about 5 nm to about 20 nm.

Figure 10:
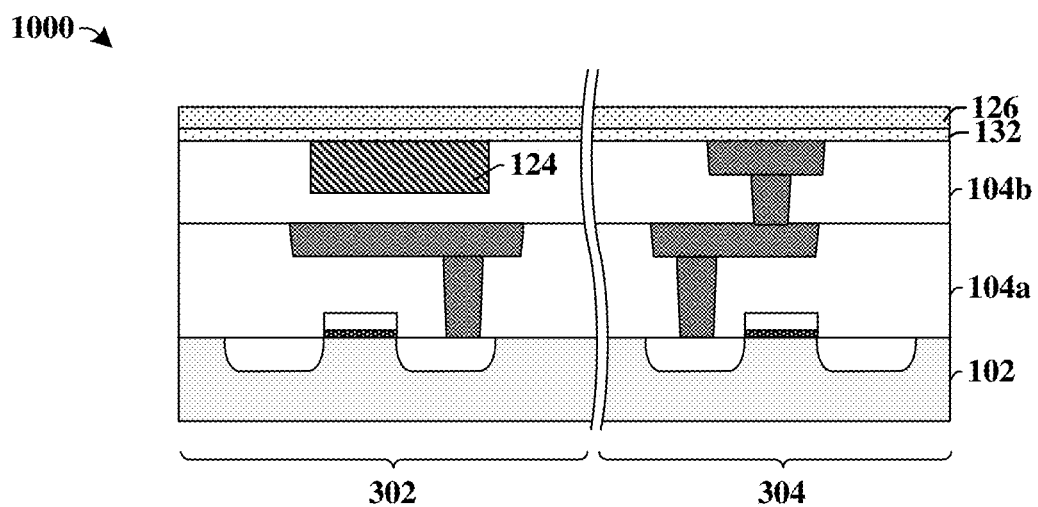

As shown in a cross-sectional view 1000 of FIG. 10, a selector gate dielectric layer 132 and a selector channel layer 126 is formed on the selector gate electrode 124 and the second ILD layer 104b. In some embodiments, the selector gate dielectric layer 132 and the selector channel layer 126 are respectively formed by deposition techniques, such as atomic layer depositions. The selector gate dielectric layer 132 can have a thickness in a range of from about 1 nm to about 15 nm. The selector channel layer 126 can have a thickness in a range of from about 3 nm to about 50 nm. In some embodiments, the selector gate dielectric layer 132 comprise aluminum oxide ($Al_2O_3$), Hafnium oxide ($HfO_2$), tantalum oxide ($Ta_2O_5$), Zirconium oxide ($ZrO_2$), Titanium oxide ($TiO_2$), strontium titanium oxide ($SrTiO_3$), or another high-k dielectric material, among others. In some embodiments, the selector channel layer 126 comprises an oxide semiconductor (OS) material. For example, the channel layer can be made of such as indium gallium zinc oxide (IGZO), indium zinc oxide (IZO), indium tin oxide or indium titanium oxide (ITO), or another oxide semiconductor material.

Figure 11:
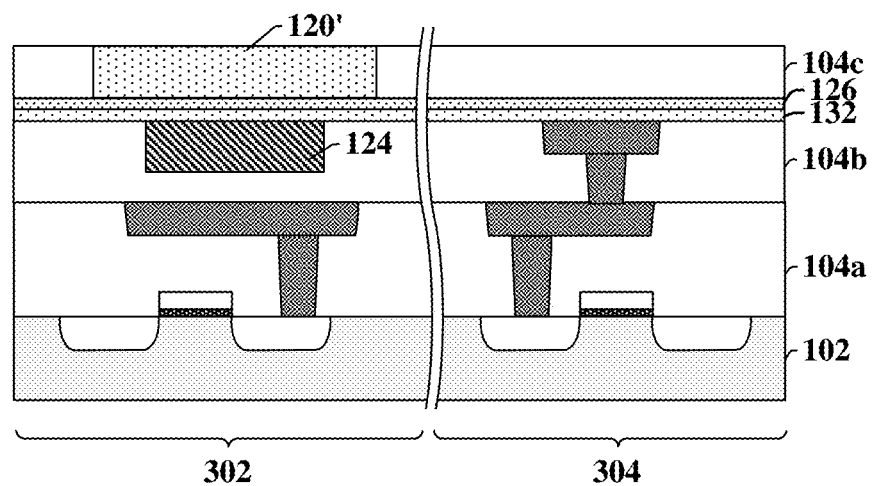

As shown in a cross-sectional view 1100 of FIG. 11, a third ILD layer 104c is formed on the selector channel layer 126, and a first selector source/drain layer 120' is formed within the third ILD layer 104c. In some embodiments, the first selector source/drain layer 120' is formed as a plurality of parallel lines vertically crossed from the selector gate electrode 124 from a top view. An example of patterns of the selector gate electrode 124 and the first selector source/drain layer 120' can be found in FIGS. 7A-7D. In some embodiments, the first selector source/drain layer 120' is formed by a deposition process followed by a patterning process. The first selector source/drain layer 120' can have a thickness in a range of from about 10 nm to about 50 nm. In some embodiments, the first selector source/drain layer 120' can be formed by titanium nitride (TiN), tantalum nitride (TaN), tungsten (W), copper (Cu), or other CMOS contact metals and/or doped semiconductor material (e.g., p-doped or n-doped polysilicon).

Figure 12:
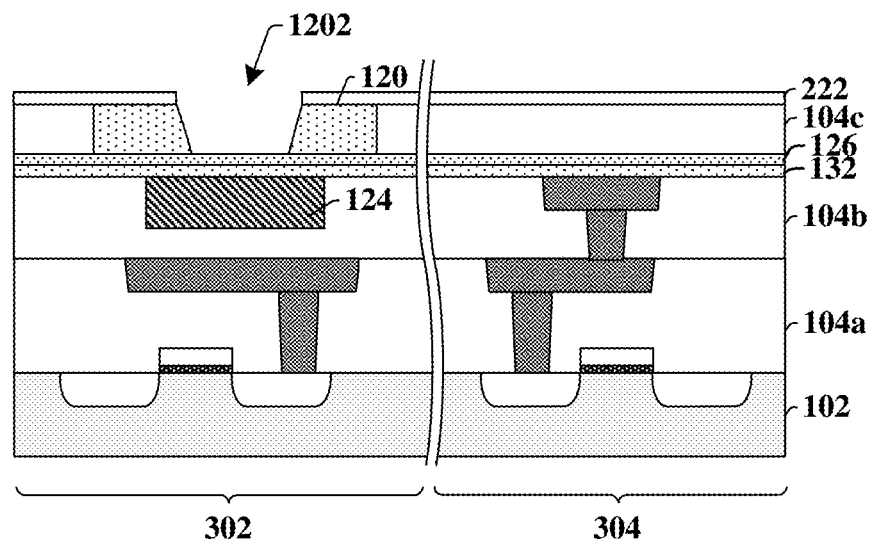

As shown in a cross-sectional view 1200 of FIG. 12, the first selector source/drain layer 120' is patterned to form an opening 1202 there through and leaving a remaining portion as a first selector source/drain region 120. The opening 1202 may be formed by a selective etching process that etches through the first selector source/drain layer 120' and stops on the selector channel layer 126.

In some embodiments, a dielectric layer 222 is formed on the first selector source/drain layer 120' and the third ILD layer 104c prior to forming the opening 1202. The dielectric layer 222 may be patterned and may function as a hard mask for the formation of the opening 1202. The dielectric layer 222 may be formed by a deposition process followed by a planarization process (e.g., a chemical mechanical planarization process), and may comprise oxide material such as silicon dioxide. In some embodiments, the dielectric layer 222 can have a thickness in a range of from about 1 nm to about 5 nm.

Figure 13:
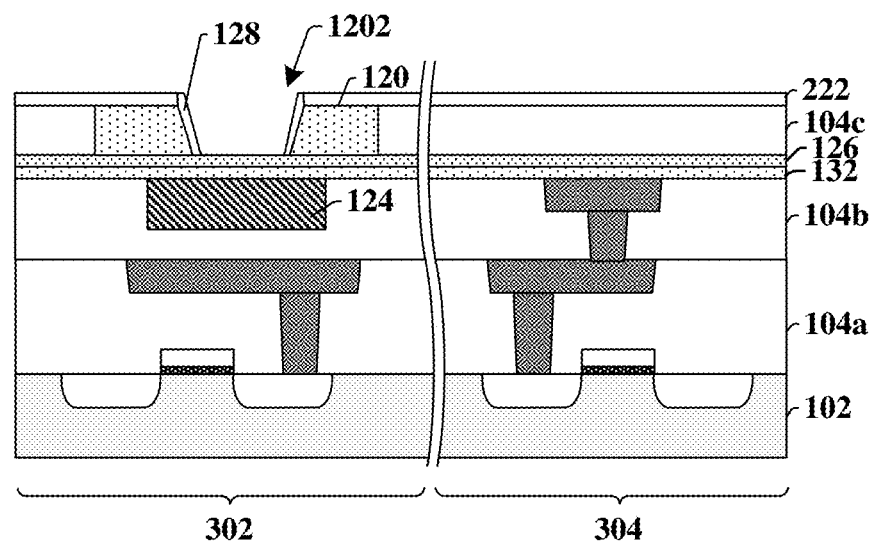

As shown in a cross-sectional view 1300 of FIG. 13, a sidewall spacer 128 is formed along a sidewall of the opening 1202. In some embodiments, the sidewall spacer 128 is formed by depositing a conformal dielectric layer followed by an etching process to expose the selector channel layer 126. In some embodiments, the etching process may be or be comprised of an anisotropic etch (e.g. a vertical dry etch) that removes lateral portions of the conformal dielectric layer including the portion overlying the selector channel layer 126 while leaving a vertical portion of the conformal dielectric layer on the sidewall of the opening 1202. In some alternative embodiments, the lateral portion of the conformal dielectric layer overlying the selector channel layer 126 is removed, while the lateral portions of the conformal dielectric layer are kept for the final device structure. The sidewall spacer 128 may be formed by dielectric materials such as silicon dioxide, silicon nitride, or the like. In some embodiments, the sidewall spacer 128 can have a thickness in a range of from about 5 nm to about 30 nm. As the thickness of the sidewall spacer 128 further decreases, for example, smaller than 5 nm or 3 nm range, a source/drain leakage may be introduced. As the thickness of the sidewall spacer 128 further increases, for example, greater than 30 nm, a driving current is reduced, and thus the transistor performance degrades.

Figure 14:
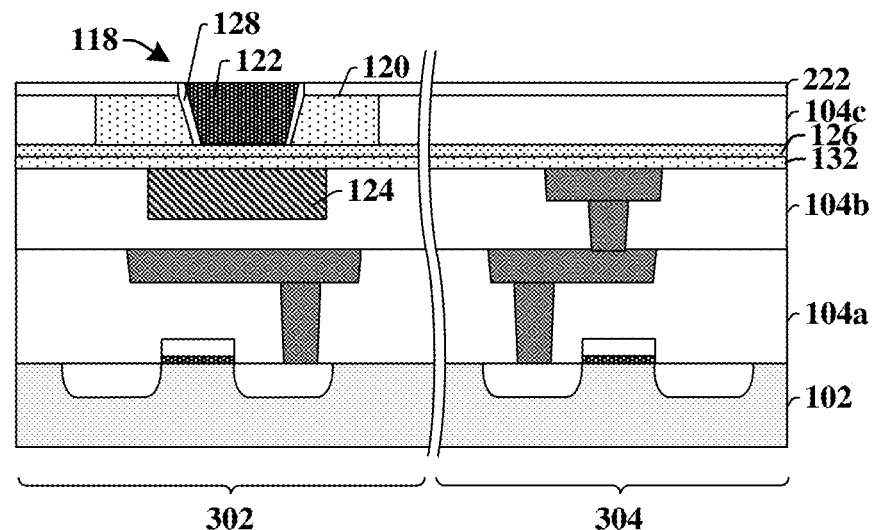

As shown in a cross-sectional view 1400 of FIG. 14, a second selector source/drain region 122 is formed in the opening 1202. In some embodiments, the second selector source/drain region 122 is formed by depositing a conductive material in the opening 1202 followed by a planarization process remove excessive portions outside the opening 1202. The second selector source/drain region 122 may have a top surface coplanar with those of the sidewall spacer 128 and/or the dielectric layer 222. In some embodiments, the sidewall spacer 128 covers a sidewall surface of the second selector source/drain region 122. The first selector source/drain region 120 and the dielectric layer 222 may collectively cover an outer sidewall of the sidewall spacer 128. In some embodiments, the second selector source/drain region 122 can have a thickness in a range of from about 10 nm to about 50 nm. The thickness of the second selector source/drain region 122 may be same or greater than that of the first selector source/drain region 120. In some embodiments, the second selector source/drain region 122 can be formed by titanium nitride (TiN), tantalum nitride (TaN), tungsten (W), copper (Cu), or other CMOS contact metals and/or doped semiconductor material (e.g., p-doped or n-doped polysilicon).

Figure 15:
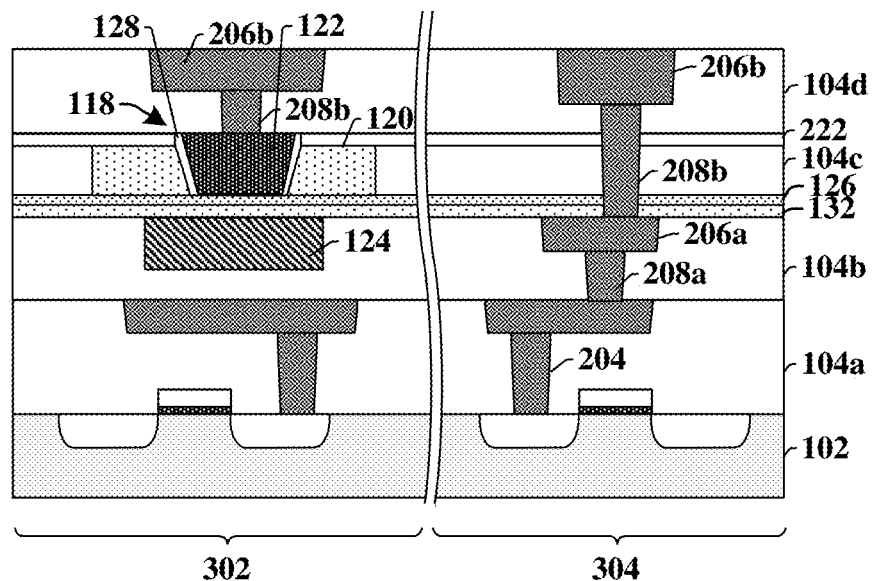

As shown in a cross-sectional view 1500 of FIG. 15, a fourth ILD layer 104d is formed over the first selector source/drain region 120 and the second selector source/drain region 122, and an intermediate interconnect metal layer is formed and electrically coupled to the second selector source/drain region 122. For example, a second interconnect via 208b may be formed through the fourth ILD layer 104d and reach on the second selector source/drain region 122, and a second interconnect line 206b may be formed on the second interconnect via 208b within the fourth ILD layer 104d. In some embodiments, the fourth ILD layer 104d is formed by a deposition process followed by a patterning process to form vias and trenches for subsequent formation of the intermediate interconnect metal layer. The second interconnect via 208*b* and the second interconnect line 206*b* may then be deposited in the vias and trenches followed by a planarization process (e.g., a chemical mechanical planarization process).

Figure 16:
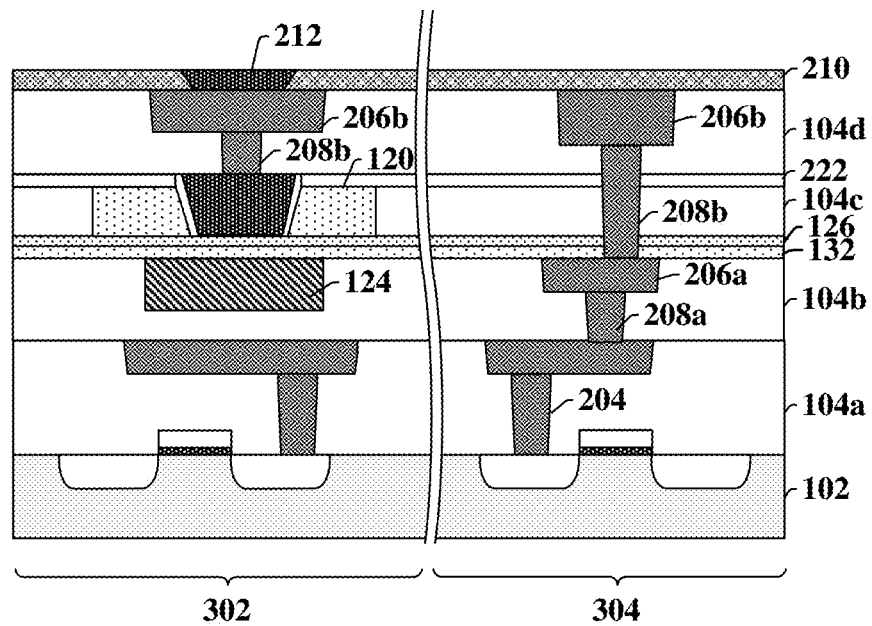

As shown in a cross-sectional view 1600 of FIG. 16, a lower insulating structure 210 is formed over the second interconnect line 206*b* and the fourth ILD layer 104*d*. In some embodiments, the lower insulating structure 210 comprises a plurality of different stacked dielectric materials. As an example, the lower insulating structure 210 may comprise silicon rich oxide, silicon carbide, silicon nitride, or the like. In some embodiments, the lower insulating structure 210 may be formed by one or more deposition processes (e.g., a physical vapor deposition (PVD) process, a chemical vapor deposition (CVD) process, a plasma enhanced CVD (PE-CVD) process, or the like). In some embodiments, the lower insulating structure 210 is selectively etched to define an opening that extends through the lower insulating structure 210 and exposes an upper surface of the intermediate interconnect metal layer. A bottom electrode via 212 may be formed within the opening.

Figure 17:
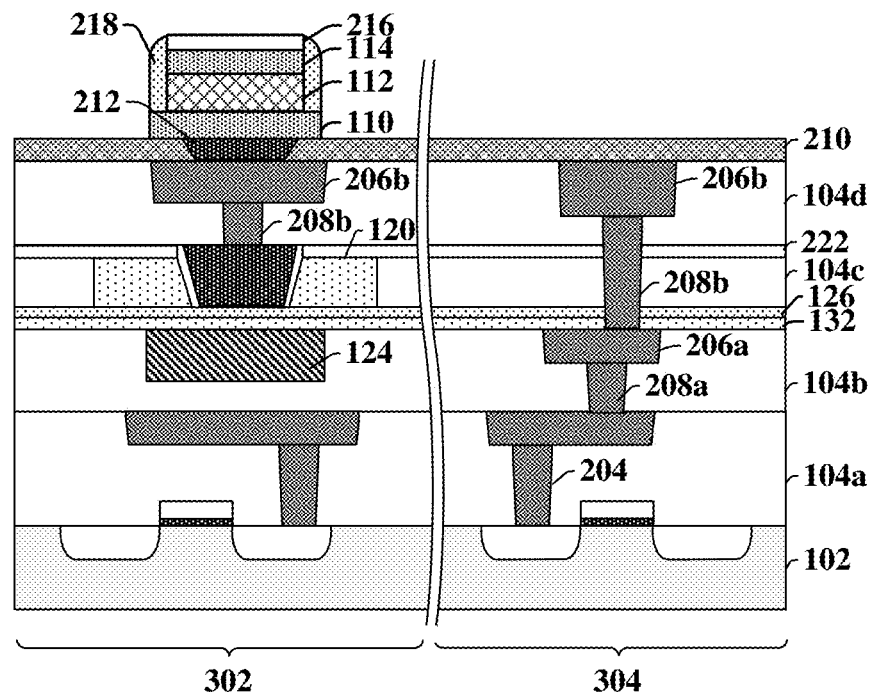

As shown in cross-sectional view 1700 of FIG. 17, a memory device stack is formed and patterned over the lower insulating structure 210 to form a memory cell 108. The memory device stack is formed by a plurality of different deposition processes such as CVD, PE-CVD, sputtering, ALD, or the like. The memory device stack is patterned by one or more patterning processes. In some embodiments, a first patterning process is performed to define a top electrode 114 and a data storage structure 112 and according to a hard mask layer 216. In various embodiments, the hard mask layer 216 may comprise a metal (e.g., titanium, titanium nitride, tantalum, or the like) and/or a dielectric material (e.g., silicon-nitride, silicon-carbide, or the like). A sidewall spacer 218 may then be formed along sidewalls of the data storage structure 112, the top electrode 114, and the hard mask layer 216. In various embodiments, the sidewall spacer 218 may comprise silicon nitride, silicon dioxide, silicon oxynitride, and/or the like. In some embodiments, the sidewall spacer 218 may be formed by forming a spacer layer over the substrate 102. The sidewall spacer layer is subsequently exposed to an etchant (e.g., a dry etchant), which removes the sidewall spacer layer from horizontal surfaces. Removing the sidewall spacer layer from horizontal surfaces leaves a part of the sidewall spacer layer along opposing sidewalls of the data storage structure 112, the top electrode 114, and the hard mask layer 216 as the sidewall spacer 218. Then, a second patterning process is performed to a bottom metal layer to define a bottom electrode 110 not covered by the hard mask layer 216 and the sidewall spacer 218.

Figure 18:
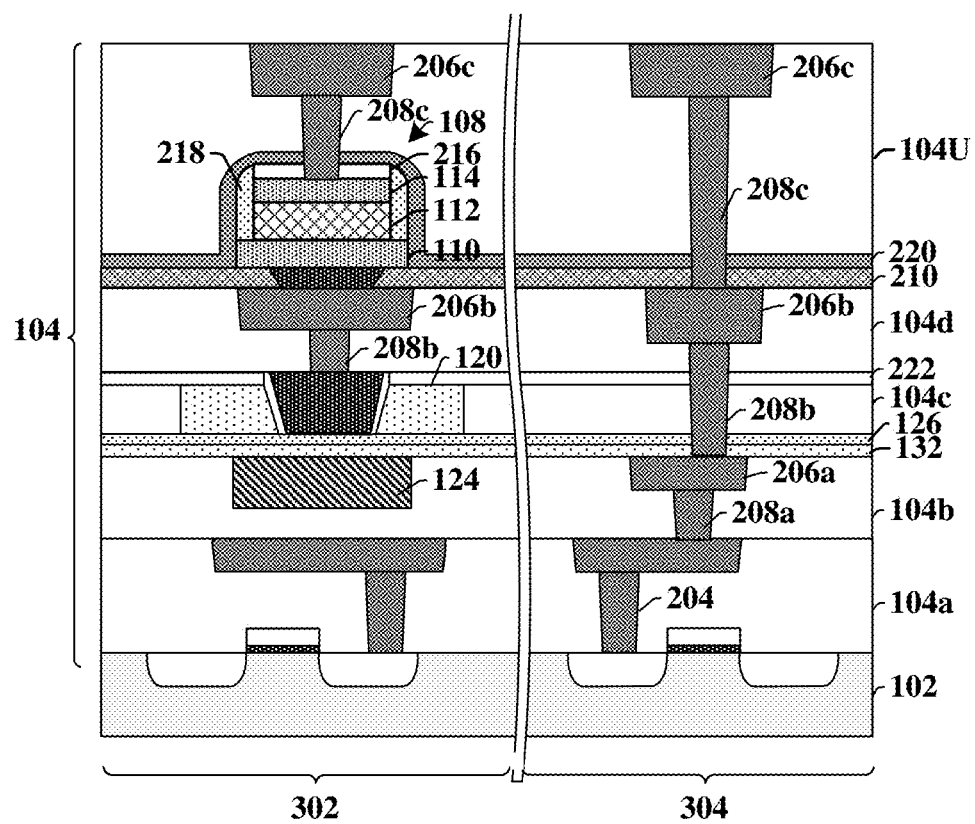

As shown in cross-sectional view 1800 of FIG. 18, an upper insulating structure 220 is formed over the memory cell 108. In some embodiments, the upper insulating structure 220 may be formed using one or more deposition techniques (e.g., PVD, CVD, PE-CVD, ALD, sputtering, etc.). In various embodiments, the upper insulating structure 220 may comprise one or more of silicon carbide, tetraethyl orthosilicate (TEOS), or the like. An upper ILD layer 104U is formed over the upper insulating structure 220 as a part of an interconnect structure 104 over the substrate 102. In some embodiments, the upper ILD layer 104U may be formed by a deposition process (e.g., PVD, CVD, PE-CVD, ALD, or the like). In various embodiments, the upper ILD layer 104U may comprise one or more of silicon dioxide, carbon doped silicon dioxide, silicon oxynitride, BSG, PSG, BPSG, FSG, USG, a porous dielectric material, or the like. Then, third interconnect vias 208*c* and third interconnect lines 206*c* are formed within the upper ILD layer 104U. In the memory region 302, the third interconnect via 208*c* and the third interconnect line 206*c* may be formed within the upper ILD layer 104U on top of the memory cell 108 to expose an upper surface of the top electrode 114. In the logic region 304, the third interconnect via 208*c* and the third interconnect line 206*c* may extend from a top surface of the upper ILD layer 104U to vertically past the memory cell 108 and further extend through the upper insulating structure 220 and the lower insulating structure 210 and reach on a lower interconnect metal layer.

Figure 19:
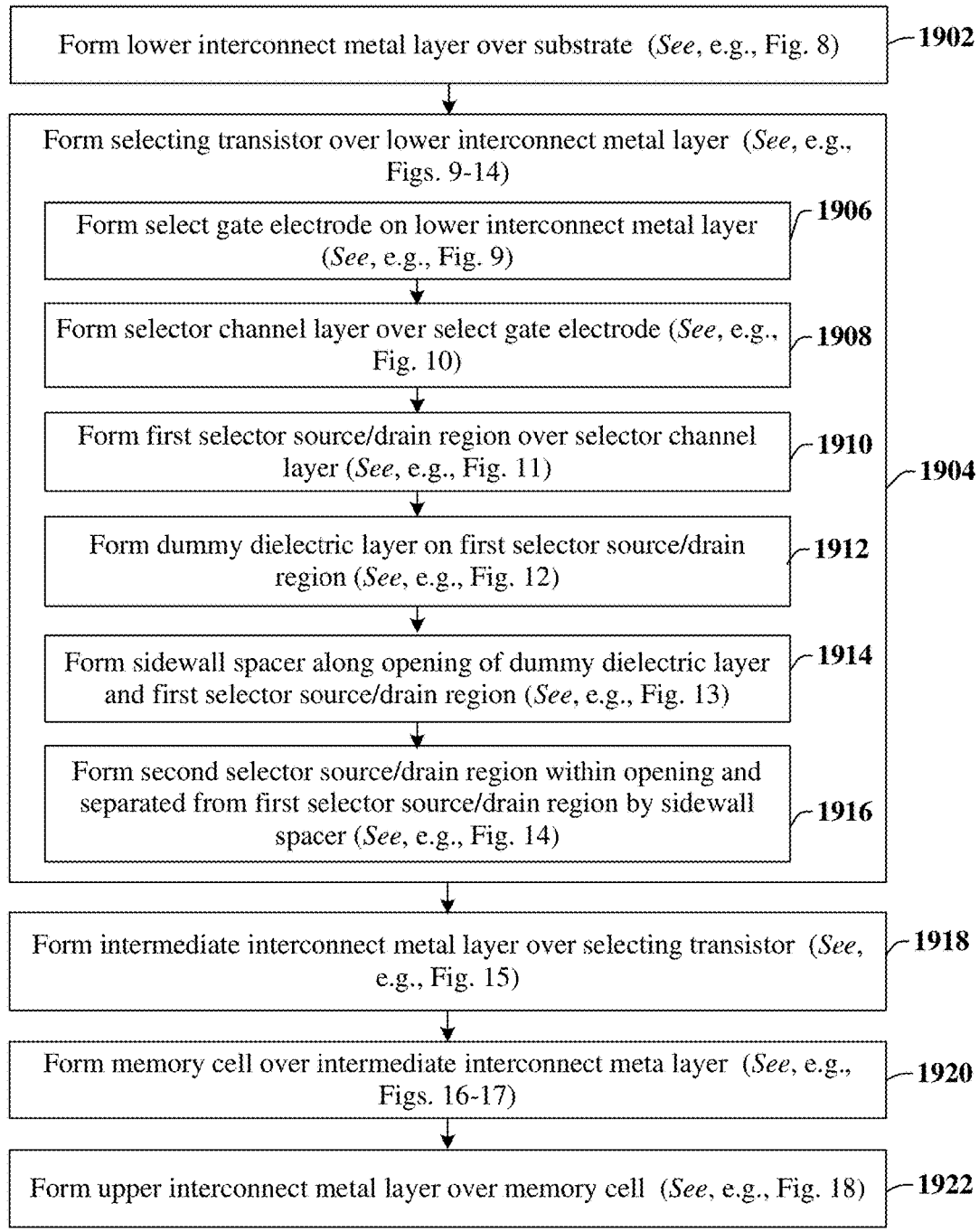
FIG. 19 illustrates a flow diagram of some embodiments of a method of forming a memory device comprising a BEOL selecting transistor.

FIG. 19 illustrates a flow diagram of some embodiments of a method 1900 of forming a memory device comprising a BEOL selecting transistor.

While method 1900 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1902, a substrate is prepared, and a lower interconnect metal layer is formed within a lower inter-level dielectric (ILD) layer over the substrate. In some embodiments, logic devices may be formed within the substrate in a memory region and/or a logic region prior to forming the lower interconnect metal layer. FIG. 8 illustrates the cross-sectional view 800 of some embodiments corresponding to act 1902.

At act 1904, a BEOL selecting transistor is formed over the lower interconnect metal layer. In some embodiments, the selecting transistor may be formed according to acts 1906-1916.

At act 1906, a select gate electrode is formed on the lower interconnect metal layer. FIG. 9 illustrates the cross-sectional view 900 of some embodiments corresponding to act 1906.

At act 1908, a selector channel layer is formed over the select gate electrode. FIG. 10 illustrates the cross-sectional view 1000 of some embodiments corresponding to act 1908.

At act 1910, a first selector source/drain region is formed over the selector channel layer. FIG. 11 illustrates the cross-sectional view 1100 of some embodiments corresponding to act 1910.

At act 1912, a dummy dielectric layer is formed on the first selector source/drain region. FIG. 12 illustrates the cross-sectional view 1200 of some embodiments corresponding to act 1912.

At act 1914, a sidewall spacer is formed along an opening of the dummy dielectric layer and the first selector source/drain region. FIG. 13 illustrates the cross-sectional view 1300 of some embodiments corresponding to act 1914.

At act 1916, a second selector source/drain region is formed within the opening and separated from the first selector source/drain region by the sidewall spacer. FIG. 14 illustrates the cross-sectional view 1400 of some embodiments corresponding to act 1916.

At act 1918, an intermediate interconnect metal layer is formed over the BEOL selecting transistor. FIG. 15 illustrates the cross-sectional view 1500 of some embodiments corresponding to act 1918.

At act 1920, a memory cell is formed over the intermediate interconnect metal layer. FIGS. 16-17 illustrate the cross-sectional views 1600-1700 of some embodiments corresponding to act 1920.

At act 1922, an upper interconnect metal layer is formed over the memory cell. FIG. 18 illustrates the cross-sectional view 1800 of some embodiments corresponding to act 1922.

Accordingly, in some embodiments, the present disclosure relates to a memory device (e.g., an MRAM or RRAM device) having a BEOL selecting transistor layer inserted between two BEOL interconnect metal layers.

In some embodiments, the present disclosure relates to a memory device. The memory device comprises a substrate and an interconnect structure disposed over the substrate. The interconnect structure comprises stacked interconnect metal layers disposed within stacked interlayer dielectric (ILD) layers. A memory cell is disposed between an upper interconnect metal layer and an intermediate interconnect metal layer. A selecting transistor is connected to the memory cell and disposed between the intermediate interconnect metal layer and a lower interconnect metal layer. The selecting transistor comprises a first selector source/drain region and a second selector source/drain region disposed on a selector channel layer. The first selector source/drain region and the second selector source/drain region are separated by a sidewall spacer.

In other embodiments, the present disclosure relates to a memory device. The memory device comprises a substrate, a substrate and an interconnect structure disposed over the substrate. The interconnect structure comprising a plurality of interconnect metal layers one stacked over another and disposed in an interlayer dielectric (ILD) layer. A plurality of memory cells is disposed within the interconnect structure and arranged in an array of rows and columns. A plurality of selecting transistors is correspondingly connected to the plurality of memory cells. The plurality of selecting transistors is disposed within the interconnect structure between a lower interconnect metal layer and an upper interconnect metal layer of the interconnect structure.

In yet other embodiments, the present disclosure relates to a method of forming a memory device. The method includes forming a lower interconnect metal layer over a substrate and surrounded by a lower interlayer dielectric (ILD) layer and forming a plurality of selecting transistors on the lower interconnect metal layer. The method further comprises forming an intermediate interconnect metal layer on the plurality of selecting transistors and forming a plurality of memory cells on the intermediate interconnect metal layer. The method further comprises forming an upper interconnect metal layer on the plurality of memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a substrate;
   an interconnect structure disposed over the substrate, the interconnect structure comprising stacked interconnect metal layers disposed within stacked interlayer dielectric (ILD) layers, the stacked interconnect metal layers comprising a lower interconnect metal layer, an intermediate interconnect metal layer, and an upper interconnect metal layer one disposed over another;
   a memory cell disposed between the upper interconnect metal layer and the intermediate interconnect metal layer; and
   a selecting transistor connected to the memory cell and disposed between the intermediate interconnect metal layer and the lower interconnect metal layer.

2. The memory device of claim 1, the selecting transistor comprising:
   a selector channel layer;
   a first selector source/drain region and a second selector source/drain region disposed on the selector channel layer; and
   a sidewall spacer disposed between and separating the first selector source/drain region and the second selector source/drain region.

3. The memory device of claim 2, wherein the selecting transistor comprises a selector gate electrode and a selector gate dielectric disposed between the lower interconnect metal layer and the selector channel layer.

4. The memory device of claim 2, wherein the sidewall spacer has a ring shape and encloses the second selector source/drain region.

5. The memory device of claim 2, wherein the second selector source/drain region has a round or oval shape from a top view.

6. The memory device of claim 2, wherein the second selector source/drain region has a square or rectangular shape from a top view and is surrounded by the first selector source/drain region.

7. The memory device of claim 2, wherein the second selector source/drain region is connected to the intermediate interconnect metal layer.

8. The memory device of claim 2, wherein the selector channel layer comprises oxide semiconductor material.

9. The memory device of claim 2, wherein the selector channel layer is made of indium gallium zinc oxide (IGZO).

10. The memory device of claim 1, wherein the memory cell comprises a bottom electrode disposed on the intermediate interconnect metal layer, a data storage structure disposed over the bottom electrode, and a top electrode disposed over the data storage structure.

11. A memory device, comprising:
    a substrate;
    an interconnect structure disposed over the substrate, the interconnect structure comprising a plurality of interconnect metal layers one stacked over another and disposed in an interlayer dielectric (ILD) layer;
    a plurality of memory cells disposed within the interconnect structure and arranged in an array of rows and columns; and
    a plurality of selecting transistors correspondingly connected to the plurality of memory cells, wherein the plurality of selecting transistors is disposed within the interconnect structure between a lower interconnect metal layer and an upper interconnect metal layer of the interconnect structure.

12. The memory device of claim 11, wherein the plurality of memory cells respectively comprises:
a bottom electrode;
a data storage structure disposed over the bottom electrode; and
a top electrode disposed over the data storage structure;
wherein a row of the memory cells shares a common bit line connecting to the top electrodes of the row of the memory cells.

13. The memory device of claim 12,
wherein the row of the selecting transistors shares a common first selector source/drain region and respectively has an individual second selector source/drain region; and
wherein the individual second selector source/drain regions are islands surrounded by the common first selector source/drain region.

14. The memory device of claim 13, wherein the individual second selector source/drain regions respectively connect to the corresponding bottom electrode.

15. The memory device of claim 13, wherein the individual second selector source/drain region is separated from the common first selector source/drain region by a sidewall spacer.

16. The memory device of claim 15, further comprising a selector channel layer disposed under the common first selector source/drain region, the individual second selector source/drain region, and the sidewall spacer.

17. The memory device of claim 11, wherein a column of the selecting transistors shares a common gate electrode or has individual gate electrodes connecting to a common word line.

18. A method of manufacturing a memory device, the method comprising:
forming a lower interconnect metal layer over a substrate and surrounded by a lower interlayer dielectric (ILD) layer;
forming a plurality of selecting transistors on the lower interconnect metal layer;
forming an intermediate interconnect metal layer on the plurality of selecting transistors;
forming a plurality of memory cells on the intermediate interconnect metal layer; and
forming an upper interconnect metal layer on the plurality of memory cells.

19. The method of claim 18, wherein forming a selecting transistor of the plurality of selecting transistors comprises:
forming a selector gate electrode within the lower ILD layer;
forming a selector channel layer over the selector gate electrode and the lower ILD layer;
forming a first selector source/drain region and a second selector source/drain region on the selector channel layer; and
forming the intermediate interconnect metal layer on the second selector source/drain region.

20. The method of claim 19, wherein forming the first selector source/drain region and the second selector source/drain region comprises:
forming a first selector source/drain layer on the selector channel layer;
forming a trench through the first selector source/drain layer;
forming a sidewall spacer along a sidewall of the trench; and
filling the second selector source/drain region in the trench.

* * * * *